(12) United States Patent
Kobayashi

(10) Patent No.: US 6,352,189 B1
(45) Date of Patent: Mar. 5, 2002

(54) BALL SUCTION HEAD

(75) Inventor: Shigeharu Kobayashi, Ishikawa (JP)

(73) Assignee: Shibuya Kogyo Co., Ltd., Ishikawa (JP)

( * ) Notice: Subject to any disclaimer, the term of this patent is extended or adjusted under 35 U.S.C. 154(b) by 0 days.

(21) Appl. No.: 09/585,289

(22) Filed: Jun. 2, 2000

(30) Foreign Application Priority Data

Jun. 3, 1999 (JP) .......................... P11-156998

(51) Int. Cl.⁷ .................................. B23Q 16/00
(52) U.S. Cl. ........................ 228/8; 228/41; 228/246
(58) Field of Search .................... 228/102, 103, 228/245, 246, 33, 41, 8, 9, 10, 11

(56) References Cited

U.S. PATENT DOCUMENTS

| | | | | |
|---|---|---|---|---|
| 5,655,704 A | * | 8/1997 | Sakemi et al. | |
| 5,657,528 A | | 8/1997 | Sakemi et al. | |
| 5,749,614 A | * | 5/1998 | Reid et al. | |
| 5,762,258 A | * | 6/1998 | Le Coz et al. | |
| 6,119,927 A | * | 9/2000 | Ramos et al. | |
| 6,126,063 A | * | 10/2000 | Vongfuangfoo et al. | |
| 6,176,008 B1 | * | 1/2001 | Ueoka | |
| 6,186,389 B1 | * | 2/2001 | Nakajima et al. | |

FOREIGN PATENT DOCUMENTS

| | | | | |
|---|---|---|---|---|
| JP | 11-87419 | | 3/1999 | ........... H01L/21/60 |
| JP | 411186310 A | * | 7/1999 | |
| JP | 02001015642 A | * | 1/2001 | |
| JP | 02001053428 A | * | 2/2001 | |

* cited by examiner

Primary Examiner—Tom Dunn
Assistant Examiner—Kiley Stoner
(74) Attorney, Agent, or Firm—Sughrue Mion, PLLC

(57) ABSTRACT

In a ball suction head, a main body thereof has a large number of ball suction holes and its inside space is to be decompressed. A mask is provided in the inside space of the main body to thereby close a predetermined number of the ball suction holes. A changeover member changes opening and closing of the suction holes by the mask.

5 Claims, 3 Drawing Sheets

BALL SUCTION HEAD

BACKGROUND OF THE INVENTION

1. Field of the Invention

The present invention relates to improvement of a ball suction head, in a ball mount apparatus, for mounting solder balls, solder bumps, or the like, on a substrate or a wafer. The present invention was chiefly developed with the primary object of a suction head for sucking solder balls in a BGA (Ball Grid Array) solder ball mount apparatus for mounting solder balls all over a wafer.

The present application is based on Japanese Patent Application No. Hei. 11-156998, which is incorporated herein by reference.

2. Description of the Related Art

In a BGA solder ball mount apparatus, a ball suction head 1 for sucking solder balls 7 has, in its lower surface, a large number of suction holes 2 for sucking the solder balls 7, as shown in FIG. 6. The ball suction head 1 is decompressed by vacuum means so as to suck the solder balls 7 from a solder ball supply tray 8. In the background art, the number of solder balls 7 sucked by the ball suction head 1 at a time was about 200, and there was therefore no special problem. However, with recent miniaturization of the solder balls 7 and with recent technological developments in mounting solder balls 7 on a wafer, a large number (tens of thousands) of solder balls 7 are sucked by the ball suction head 1.

When the ball suction head 1 sucks a large number of solder balls 7 at a time or when the diameter of each ball suction hole 2 of the ball suction head 1 increases, it is required to increase the size of the decompression means for decompressing the ball suction head 1. Thus, there arises a problem in terms of space or usefulness. In addition, when the ball suction head 1 sucks a large number of solder balls 7 at a time, there arises a problem that such a large number of solder balls 7 cannot be sucked uniformly if the capacity of the decompression means goes down.

SUMMARY OF THE INVENTION

In order to solve the foregoing problems, it is a first object of the present invention to provide a ball suction head which can suck balls uniformly with decompression means which is small in size and low in capacity. It is a second object to provide a ball suction head in which the suction area to suck the solder balls is divided and the solder balls are sucked so that the solder balls are sucked in the suction holes in an area larger than the capacity of the decompression means. It is a third object to eliminate errors in sucking solder balls so as to shorten the suction time.

In order to attain the foregoing objects, according to the present invention, a mask is provided in a ball suction head for a ball mount apparatus which has a large number of ball suction holes and is connected with a decompression source through a suction path. The mask provides with one position at which suction force acts on predetermined ones of ball suction holes and another position at which suction force does not act on the predetermined ones of ball suction holes.

Features and advantages of the invention will be evident from the following detailed description of the preferred embodiments described in conjunction with the attached drawings.

DETAILED DESCRIPTION OF THE PREFERRED EMBODIMENTS

Figure 1:
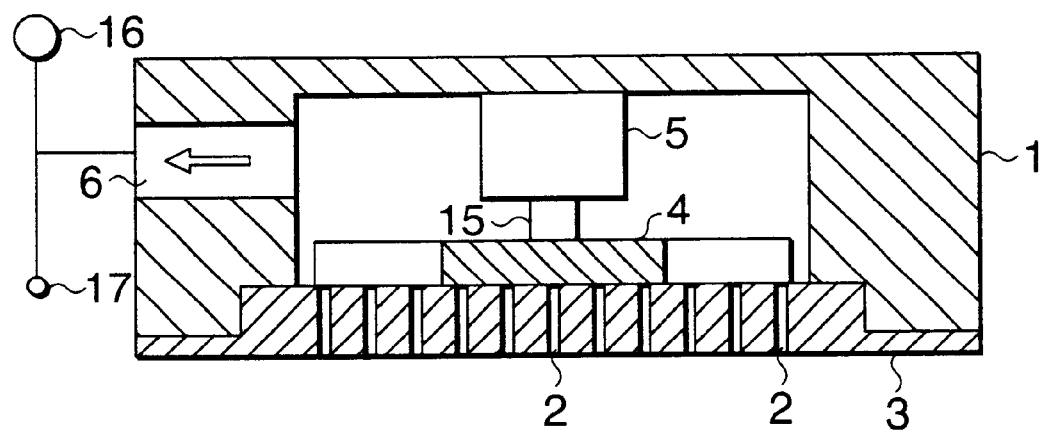
FIG. 1 shows a sectional view of a ball suction head with a mask according to a first embodiment of the present invention.

Description will be made below about the mode for carrying out the invention along with its embodiment with reference to the drawings. A BGA solder ball mount apparatus using a ball suction head 1 according to the present invention includes the ball suction head 1 with a mask, and suction detection means (for example, pressure sensor 17). The ball suction head 1 is adapted to suck solder balls 7 stored in a ball tray and to mount the solder balls 7 on a wafer on a stage.

A suction plate 3 in which a large number of ball suction holes 2 are formed is attached to the lower surface of the ball suction head 1, as shown in FIGS. 1, 3 to 5. In the illustrated embodiment, the ball suction holes 2 and the solder balls 7 are drawn schematically for clearly showing relations between the ball suction holes 2 and the solder balls 7. Actually, the solder balls 7 are very small, and the number of the ball suction holes 2 sometimes amounts to tens of thousands.

Figure 2:
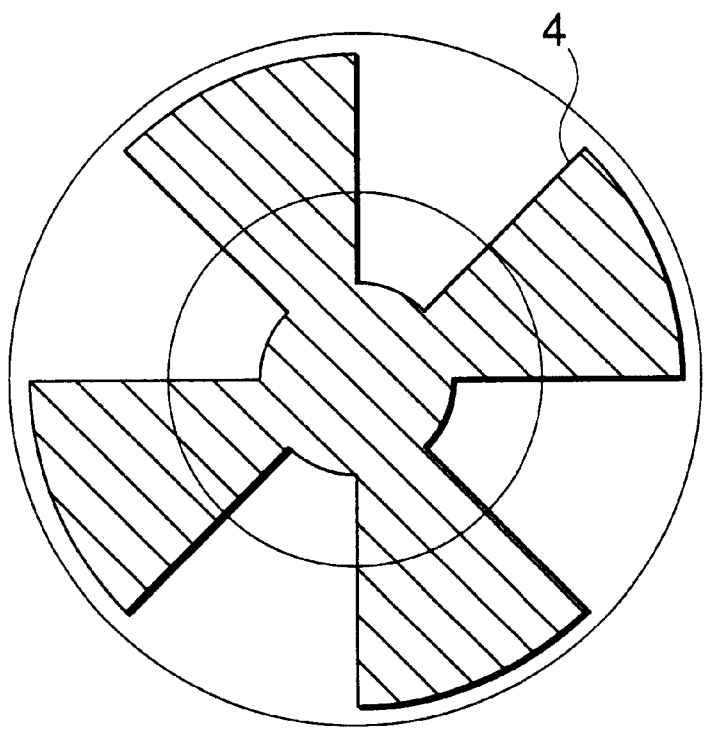
FIG. 2 shows a plan view of the mask.
Figure 3:
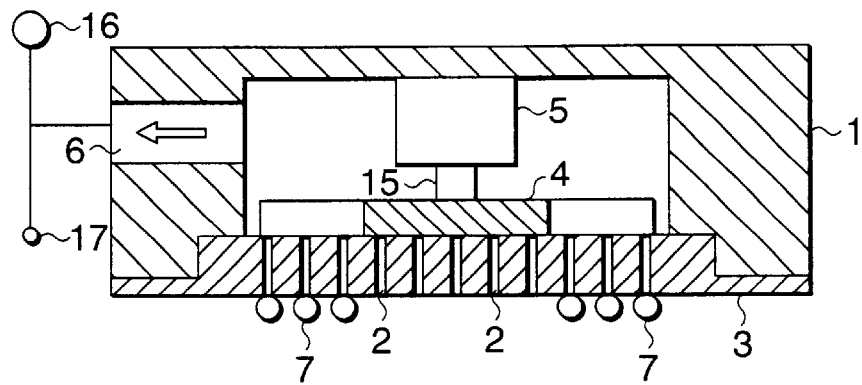
FIG. 3 shows a sectional view showing a partial suction state by the ball suction head according to the first embodiment.
Figure 4:
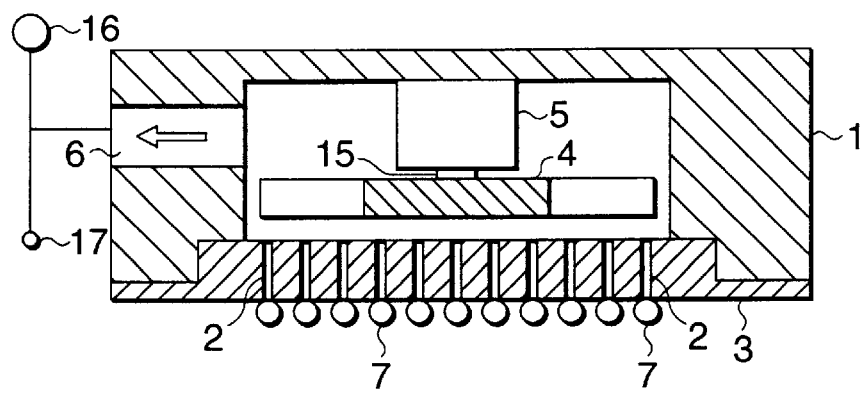
FIG. 4 shows a sectional view showing a full suction state by the ball suction head according to the first embodiment.

A movable mask 4 which can close and open predetermined ones of the ball suction holes 2 is provided inside the ball suction head 1 according to a first embodiment shown in FIGS. 1, 3 and 4. In this embodiment, on the assumption that the solder balls 7 are mounted on a wafer, the suction holes 2 are arranged in a circle, and the mask 4 is shaped in accordance with the circle as shown in FIG. 2. Further, the mask 4 is made capable of closing half (50%) of the suction holes 2 formed in the suction plate 3. Since the mask 4 which can close half of the suction holes 2 is provided, decompression means can be implemented with a pump having half of required capacity, in comparison with the case where the solder balls 7 are sucked in all the suction holes 2 at a time.

The mask 4 in the embodiment can cope with 4- to 8-inch wafers. The shape of the mask 4 is made like a 4-bladed propeller. The mask 4 is, however, not limited to this shape, but it will go well so long as the mask 4 can close half of the suction holes 2.

Further, although the mask 4 can close half of the suction holes 2 according to the present embodiment, the size of the mask which can close the suction holes 2 is not limited to this. The size of the mask can be set at option so as to be accommodated in the ball suction head.

The mask 4 is provided with an air cylinder 5 as means for changing opening/closing of the suction holes 2 by means of the mask 4 (means for moving the mask 4). The mask 4 is attached to a rod 15 of the air cylinder 5 provided in the ball suction head 1, so that the mask moves vertically between the inner surface of the suction plate 3 and a refuge position above the suction plate 3 in the ball suction head 1 in accordance with the operation of the air cylinder 5.

Incidentally, the means for changing over the mask 4 may be provided outside the ball suction head 1. That is, if the air cylinder 5 is used, the main body of the air cylinder 5 is provided on the external upper portion of the ball suction head 1, and only the rod 15 of the air cylinder 5 is inserted into the ball suction head 1. Thus, the mask 4 is attached to the rod 15.

The ball suction head 1 is connected with a decompression source 16 through a suction path 6 and decompressed in the direction of a center arrow in FIGS. 1, 3 and 4 so as to suck the solder balls 7 stored in the ball tray. A vacuum pump or a blower motor is used as the decompression source 16.

Description will be made below about the operation of the ball suction head 1 according to the first embodiment. The ball suction head 1 is moved down onto the ball tray which stores the solder balls 7. Before the ball suction head 1 begins to suck the solder balls 7, the mask 4 is moved down onto the inner surface of the suction plate 3 by the air cylinder 5, and brought into tight contact therewith so as to close half of the suction holes 2 arranged on the suction plate 3. FIG. 1 shows this state.

In this state, the air in the ball suction head 1 is sucked by the decompression source 16 connected to the suction path 6 so that the solder balls 7 are sucked in the suction holes 2 of the suction plate 3 which are not closed by the mask 4. FIG. 3 shows this state.

Thereafter, it is detected by the detection means (for example, pressure sensor 17) whether the solder balls 7 have been sucked or not in all the suction holes 2 other than the suction holes closed by the mask 4. The pressure sensor 17 is used as the detection means for detecting whether the solder balls 7 have been sucked or not in all the suction holes 2 other than the suction holes closed by the mask 4. The pressure sensor 17 is used as the detection means for detecting whether the solder balls 7 have been sucked or not in all the suction holes 2 other than the suction holes closed by the mask 4. The pressure sensor 17 may be replaced by a timer. When all the suction holes 2 which are not closed by the mask 4 have sucked the solder balls 7, the pressure in the ball suction head 1 drops (the degree of vacuum increases). When the pressure reaches a predetermined value, the changeover means is actuated in accordance with a command from the detection means. That is, the mask 4 is released from the suction plate 3 by the air cylinder 5 so as to take refuge above and allow the rest of the suction holes 2 to suck the solder balls 7. FIG. 4 shows this state. After the solder balls 7 have been sucked in all the suction holes 2, the solder balls 7 are mounted on a wafer on the stage.

The mask 4 in the first embodiment is directly abutted on the suction holes 2 and closes the suction holes. However, it is solely required that the mask 4 can set two positions, one is at which suction force acts on the suction holes 2, another is at which the suction force does not act on the suction holes. Accordingly, it should be allowed to configure the ball suction head such that the mask 4 indirectly acts on the suction holes 2 as in a second embodiment shown in FIG. 5.

The ball suction head 1 according to the second embodiment has, in its lower surface, a punching metal 18 as a gas conducting path forming member, a support plate 19 constituted by a fine net as a gas permeable member, and a suction plate 3 provided with ball suction holes 2 for sucking solder balls 7. These punching metal 18, support plate 19, suction plate 3 are integrally attached on the lower surface of the ball suction head 1 by a plate holder. The mask 4 is disposed to be brought into contact with the punching metal 18. Each configuration of the mask 4, moving means (opening/closing changing means), the pressure sensor 17, or the like may be same as in the first embodiment.

Figure 5:
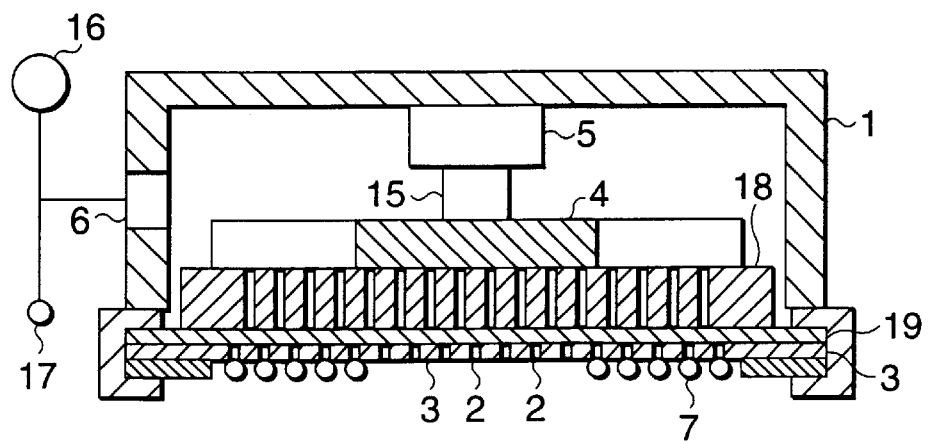
FIG. 5 shows a sectional view of a ball suction head according to a second embodiment of the present invention.
Figure 6:
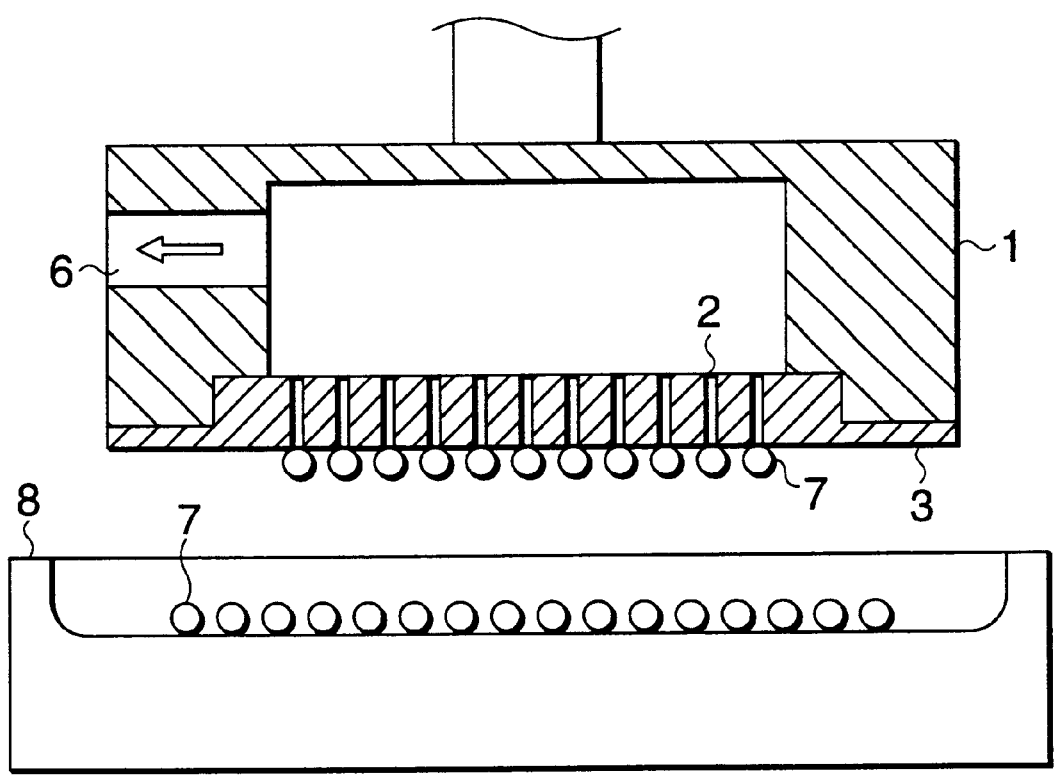
FIG. 6 shows a view showing a background-art ball suction head.

As shown in FIG. 5, the punching metal 18 has gas conducting paths which do not correspond to the suction holes 2 of the suction plate 3. The gas conducting paths are formed to be 3.8 mm in hole diameter and 5 mm in pitch. The punching metal 18 is to support the support plate 19 against external force so as to prevent the suction plate 3 from bending due to negative pressure at the time of sucking the solder balls 7, reaction force from the wafer, or other reasons. A support member having a honeycomb structure may be used instead of the punching metal 18.

The support plate 19 is disposed between the suction plate 3 and the punching metal 18 as shown in FIG. 5. The support plate 19 is formed by pasting a high-tension resin net as a gas permeable member onto a center opening portion of a frame in which a stainless plate 0.15 mm thick is opened at its center to be large enough to cover a suction area of the suction plate 3. A metal net or a porous material may be used instead of the high tension resin net. The support plate 19 makes a layer in which the air flows between the punching metal 18 and the suction plate 3 in order to produce a uniform ball suction state all over the suction area of the suction plate 3.

In the aforementioned second embodiment, the mask 4 does not close the ball suction holes 2 directly, and closes a part of the gas conducting paths of the punching metal 18. Also under this structure, it becomes possible to set two positions of the mask 4. First one is a position at which a suction force capable of sucking the solder balls 7 acts on the solder balls, and second one is a position at which such a force does not act on the solder balls 7. The same effect as according to the first embodiment can be achieved by the operation of the mask 4 in the second embodiment.

Since the present invention is configured and operated as described above, it has the following effects.

First, a mask is provided in the inside of a ball suction head, and the mask provides with one position at which suction force acts on predetermined ones of ball suction holes and another position at which suction force does not act on the predetermined ones of ball suction holes. The efficiency in sucking balls in the suction holes on which suction force act can be enhanced by using the mask (closing the predetermined suction holes). After this suction, the mask is released, and balls are sucked in the rest suction holes. Thus, it was possible to provide a ball suction head in which decompression means could be made smaller in size and lower in capacity than that in the background art, and in which ball suction could be achieved uniformly.

Secondly, a mask which can cause suction force on only predetermined ones of ball suction holes is provided in a ball suction head so as to divide the suction area and suck solder balls. Thus, it is possible to provide a ball suction head which can suck solderballs in an area which is wider than the capacity of the decompression means. In addition, the suction efficiency is enhanced so that it is possible to shorten the suction time.

Thirdly, there is provided detection means for detecting that the balls have been sucked in the suction holes, and the changeover means was actuated in accordance with a command from the detection means so as to open the suction holes closed by the mask. As a result, it is possible to show the aforementioned effects surely.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A ball suction head comprising:
   a main body having a number of ball suction holes and an inside space to be decompressed;
   a mask provided in the inside space of said main body to close a predetermined number of the ball suction holes; and
   a member for moving said mask so as to open and close said ball suction holes.

2. A ball suction head according to claim 1, wherein said member for moving said mask is an air cylinder.

3. A ball suction head comprising:
   a main body having a number of ball suction holes and an inside space to be decompressed;
   a mask provided in the inside space of said main body to close a predetermined number of the ball suction holes;
   a changeover member for changing opening and closing of said suction holes by said mask; and
   a detection member for detecting balls sucked in the suction holes other than the suction holes closed by said mask, whereby said changeover member is actuated in accordance with a command from said detection means so as to open the suction holes closed by said mask.

4. A ball suction head comprising:
   a main body having a number of ball suction holes and an inside space to be decompressed;
   a mask provided in the inside space of said main body, said mask moving between (i) a first position at which suction force acts on a predetermined number of the ball suction holes and (ii) a second position at which the suction force does not act on the predetermined number of the ball suction holes, when the inside space of said main body is decompressed; and
   a member for moving said mask between the first position and the second position.

5. A ball suction head comprising:
   a main body;
   a suction plate disposed on a lower portion of said main body and having a number of ball suction holes;
   an inside space defined in said main body and above said suction plate, said inside space being connected to a decompression source through a suction path formed in said main body;
   a mask provided in said inside space of said main body, said mask moving between (i) a first position at which suction force acts on a predetermined number of the ball suction holes and (ii) a second position at which the suction force does not act on the predetermined number of the ball suction holes, when the inside space of said main body is decompressed; and
   a member for moving said mask between the first position and the second position.

* * * * *